US012624979B2

(12) United States Patent
Chung et al.

(10) Patent No.: US 12,624,979 B2
(45) Date of Patent: May 12, 2026

(54) METHOD OF MEASURING PHYSICAL PROPERTIES

(71) Applicant: National Central University, Taoyuan City (TW)

(72) Inventors: Chih-Ang Chung, Taoyuan City (TW); Chun-Hung Weng, Taoyuan City (TW); Wei-Xu Cai, Taoyuan City (TW); Han-Xiang Li, Taoyuan City (TW)

(73) Assignee: National Central University, Taoyuan City (TW)

( * ) Notice: Subject to any disclaimer, the term of this patent is extended or adjusted under 35 U.S.C. 154(b) by 514 days.

(21) Appl. No.: 18/311,231

(22) Filed: May 2, 2023

(65) Prior Publication Data

US 2024/0263983 A1     Aug. 8, 2024

(30) Foreign Application Priority Data

Feb. 3, 2023   (TW) ................................ 112103935

(51) Int. Cl.
  *G01F 13/00*     (2006.01)
  *G06F 30/27*     (2020.01)
    (Continued)
(52) U.S. Cl.
  CPC .............. *G01F 13/00* (2013.01); *G06F 30/27* (2020.01); *G06F 30/28* (2020.01); *G06N 3/08* (2013.01)
(58) Field of Classification Search
  CPC ...... G01F 13/00; G01F 13/006; G01F 13/008; G01F 1/007; G01F 1/86; G01F 1/74;
    (Continued)

(56) References Cited

U.S. PATENT DOCUMENTS 11,808,746 B2 * 11/2023 Shah ........................ C23C 16/52
12,061,980 B2 * 8/2024 Filippov ................. E21B 43/00
            (Continued)

FOREIGN PATENT DOCUMENTS

CN        113272655 A      8/2021
EP          3438989 A1 *  2/2019   ............. G16H 50/50
            (Continued)

OTHER PUBLICATIONS

S.J. Roach et al., "A dynamic approach to determining the surface tension of a fluid," Canadian Metallurgical Quarterly, 42(2), pp. 175-186, 2003.

(Continued)

*Primary Examiner* — Jeffrey P Aiello
(74) *Attorney, Agent, or Firm* — CKC & Partners Co., LLC

(57)        ABSTRACT
A method of measuring physical properties includes a number of operations. Simulated mass flow rate data of training physical property parameter sets are generated by a computing unit based on the training physical property parameter sets and vessel shape information. Deep learning model is trained by a processor based on a training data set with an input feature vector of the simulated mass flow rate data and an output feature vector of the training physical property parameter sets. Measured fluid is received by a loader through an opening of a vessel of the vessel shape information. Weight accumulation data of weight of the loader is measured by a scale during a time period to obtain measured mass flow rate data. The measured mass flow rate data is inputted to the deep learning model to obtain measured physical property parameter set of the measured fluid.

14 Claims, 7 Drawing Sheets

(51) Int. Cl.
    *G06F 30/28*        (2020.01)
    *G06N 3/08*         (2023.01)

(58) Field of Classification Search
    CPC ... G01F 1/36; G01F 1/684; G01F 1/84; G01F
               23/20; G01F 25/14; G01F 25/17; G01F
               25/10; G06F 30/27; G06F 30/28; G06F
               2113/08; G06N 3/08; G06N 3/0464;
               G06N 3/09; G06N 20/00
    USPC ..... 73/149; 700/109, 282; 702/45, 179, 181,
               702/183, 1, 100, 155, 85; 703/1, 2
    See application file for complete search history.

(56)              References Cited

U.S. PATENT DOCUMENTS

2021/0110089 A1 *   4/2021   Chen ......................... B25J 9/163
2021/0340869 A1 *  11/2021   Syresin ............... E21B 49/0875
2023/0003704 A1 *   1/2023   Shah ...................... C23C 16/448
2023/0417949 A1 *  12/2023   Gervais-Couplet .... G01V 20/00

FOREIGN PATENT DOCUMENTS

RU          2754656 C1 *   9/2021   ............. E21B 41/10
TW          I706124 B     10/2020
WO    WO-2019181541 A1 *   9/2019   ............. G16Z 99/00

OTHER PUBLICATIONS

S.J. Roach et al., "A new method to dynamically measure the surface tension, viscosity, and density of melts," Metallurgical and Materials Transactions B, 36(5), 667-676, 2005.

Chun-Hung Weng, "Using Computational Fluid Dynamics combined with Draining Vessel Method to Measure the Physical Properties of Newtonian and Non-Newtonian Fluid," 2021. Master Thesis. National Central University.

\* cited by examiner

400

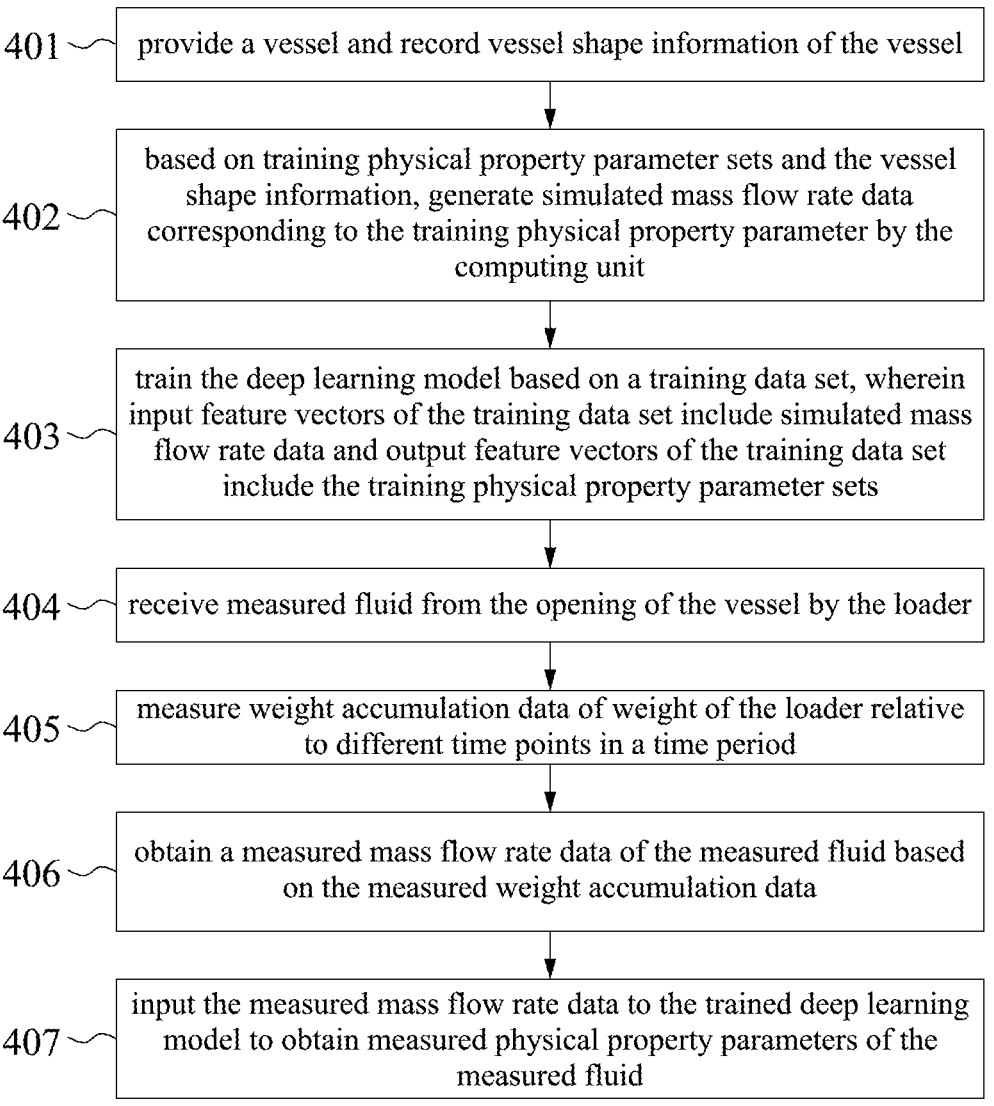

401 — provide a vessel and record vessel shape information of the vessel

402 — based on training physical property parameter sets and the vessel shape information, generate simulated mass flow rate data corresponding to the training physical property parameter by the computing unit 403 — train the deep learning model based on a training data set, wherein input feature vectors of the training data set include simulated mass flow rate data and output feature vectors of the training data set include the training physical property parameter sets 404 — receive measured fluid from the opening of the vessel by the loader 405 — measure weight accumulation data of weight of the loader relative to different time points in a time period 406 — obtain a measured mass flow rate data of the measured fluid based on the measured weight accumulation data 407 — input the measured mass flow rate data to the trained deep learning model to obtain measured physical property parameters of the measured fluid

Fig. 5

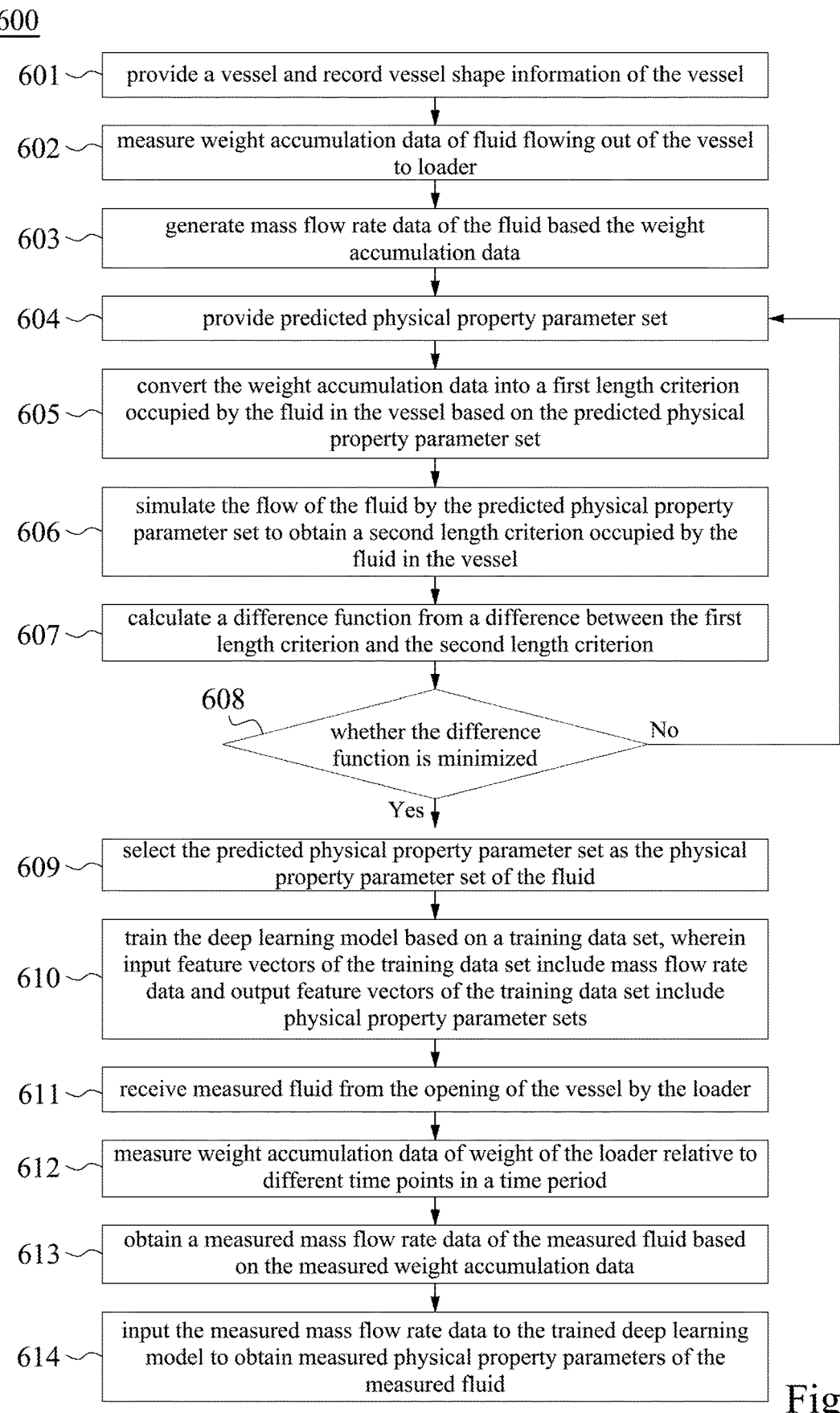

600

601 — provide a vessel and record vessel shape information of the vessel

602 — measure weight accumulation data of fluid flowing out of the vessel to loader 603 — generate mass flow rate data of the fluid based the weight accumulation data 604 — provide predicted physical property parameter set 605 — convert the weight accumulation data into a first length criterion occupied by the fluid in the vessel based on the predicted physical property parameter set 606 — simulate the flow of the fluid by the predicted physical property parameter set to obtain a second length criterion occupied by the fluid in the vessel 607 — calculate a difference function from a difference between the first length criterion and the second length criterion 608 — whether the difference function is minimized     No Yes 609 — select the predicted physical property parameter set as the physical property parameter set of the fluid 610 — train the deep learning model based on a training data set, wherein input feature vectors of the training data set include mass flow rate data and output feature vectors of the training data set include physical property parameter sets 611 — receive measured fluid from the opening of the vessel by the loader 612 — measure weight accumulation data of weight of the loader relative to different time points in a time period 613 — obtain a measured mass flow rate data of the measured fluid based on the measured weight accumulation data 614 — input the measured mass flow rate data to the trained deep learning model to obtain measured physical property parameters of the measured fluid

Fig. 6

METHOD OF MEASURING PHYSICAL PROPERTIES

CROSS-REFERENCE TO RELATED APPLICATION

This application claims priority to Taiwan application Serial Number 11/210,3935, filed Feb. 3, 2023, which is herein incorporated by reference in its entirety.

BACKGROUND

Field of Invention

The present disclosure relates to method of measuring physic properties.

Description of Related Art

Measurement of fluid properties is an important issue in engineering. In early developments, fluid properties such as density could be obtained experimentally through Bernoulli's principle and corresponding flow channel design. For example, in some designed measurement methods, fluid properties can be obtained through the draining vessel method, especially for high-temperature molten fluids. In general, in the measurement of the draining vessel method, it takes a considerable amount of time to perform the corresponding fluid simulation calculations and costs a lot of time.

Therefore, providing a solution that can improve the time required for measurement in the draining vessel method is one of the problems to be solved for the industry.

SUMMARY

An aspect of the present disclosure is related to a method of measuring physical properties.

According to one or more embodiments, a method of measuring physical properties includes a number of operations. A plurality of simulated mass flow rate data corresponding to a plurality of training physical property parameter sets is generated by a computing unit based on the training physical property parameter sets and vessel shape information. A deep learning model is trained by a processor based on a training data set, wherein an input feature vector of the training data set includes the simulated mass flow rate data and an output feature vector of the training data set includes the training physical property parameter sets. A measured fluid is received by a loader through an opening of a vessel corresponding to the vessel shape information. A weight accumulation data of a weight of the loader is measured by a scale during a time period. A measured mass flow rate data of the measured fluid is obtained based on the weight accumulation data. The measured mass flow rate data is inputted to the deep learning model to obtain a measured physical property parameter set of the measured fluid.

In one or more embodiments of the present disclosure, the training physical property parameter sets including a plurality of densities, a plurality of viscosities and a plurality of surface tensions. The measured physical property parameter set includes a measured density, a measured viscosity and a measured surface tension.

In one or more embodiments of the present disclosure, the vessel shape information includes a cross-section area of the vessel, a cross-section area of the opening of the vessel and a length of the opening of the vessel.

In one or more embodiments of the present disclosure, the computing unit is a computational fluid dynamics unit. Generating the simulated mass flow rate data corresponding to the training physical property parameter sets includes performing a simulation of a computational fluid dynamics algorithm by the computing unit to obtain the simulated mass flow rate data.

In one or more embodiments of the present disclosure, the vessel is accommodated in a furnace. Receiving the measured fluid by the loader through the opening of the vessel corresponding to the vessel shape information includes a number of operations. A measured metal is contained in the vessel. The measured metal is heated to a determined temperature by the furnace, so that the measured metal is melted into a molten metal fluid as the measured fluid.

In one or more embodiments of the present disclosure, the simulated mass flow rate data includes a plurality of simulated mass flow rates with respect to a plurality of time points and/or with respect to a plurality of height heads. The height heads are a plurality of fluid height of the measured fluid in the vessel from a simulation performed by the computing unit.

In one or more embodiments of the present disclosure, a guide angle is provided at a top of the opening of the vessel.

In one or more embodiments of the present disclosure, the vessel is spatially separated from the loader.

An aspect of the present disclosure is related to a method of measuring physical properties.

According to one or more embodiments, a method of measuring physical properties includes a number of operations. A vessel and recording a vessel shape information of the vessel is provided. A deep learning model is trained by a processor. Training the deep learning model by the processor includes a number of operations. A weight accumulation data of a weight of a fluid flowing from the vessel to a loader during a time period is measured by a scale. A mass flow rate data of the fluid is generated based on the weight accumulation data. The weight accumulation data is converted into a first length criterion occupied by the fluid in the vessel through a predicted property parameter set and the vessel shape information. A flow of the fluid is simulated based on the predicted property parameter set and the vessel shape information to obtain a second length criterion occupied by the fluid in the vessel. A difference function is calculated based on a difference between the first length criterion and the second length criterion. The predicted property parameter set is adjusted to minimize the difference function, wherein the predicted property parameter set is selected as a physical property parameter set of the fluid when the difference function is minimize. The deep learning model is trained through a training data set, wherein an input feature vector of the training data set includes the mass flow rate data and an output feature vector of the training data set includes the physical property parameter set. The method of measuring physical properties further includes a number of operations. A measured fluid flowing out from an opening of the vessel is received by the loader. A measured weight accumulation data of a weight of the loader receiving the measured fluid relative to a plurality of time points is measured by the scale. A measured mass flow rate data of the measured fluid is obtained based on the measured weight accumulation data. The measured mass flow rate data is inputted to the deep learning model to obtain a measured physical property parameter set of the measured fluid.

In one or more embodiments of the present disclosure, simulating the flow of the fluid based on the predicted property parameter set and the vessel shape information to obtain the second length criterion occupied by the fluid in the vessel includes performing a simulation of a computational fluid dynamics algorithm to obtain the second length criterion.

In one or more embodiments of the present disclosure, the first length criterion is a first height head obtained by converting the weight accumulation data into a first fluid height of the fluid in the vessel. The second length criterion is a second height head obtained by simulating a second fluid height of the fluid in the vessel.

In some embodiments, the first height head and the second height head are functions relative to the time points.

In one or more embodiments of the present disclosure, the predicted property parameter set includes a density, a viscosity and a surface tension. The measured physical property parameter set includes a measured density, a measured viscosity and a measured surface tension of the measured fluid.

In one or more embodiments of the present disclosure, a guide angle is provided at a top of the opening of the vessel. The vessel shape information includes a cross-section area of the vessel, a cross-section area of the opening of the vessel, a length of the opening of the vessel and the guide angle.

In one or more embodiments of the present disclosure, the vessel is spatially separated from the loader.

In summary, by pre-constructing a deep learning model for a vessel in the corresponding physical property measuring device, it would be able to effectively reduce time required to measure physical properties by performing a draining vessel method.

The above description is only used to explain the problems to be solved by the present disclosure, the technical means for solving the problems and the produced effects. The specific details of the present disclosure are described in detail in the following embodiments and related drawings.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

FIG. 5 illustrates a schematic flow chart of a method of measuring physical properties according to one or more embodiments of the present disclosure;

FIG. 6 illustrates a schematic flow chart of a method of measuring physical properties according to one or more embodiments of the present disclosure.

DETAILED DESCRIPTION

Figure 1:
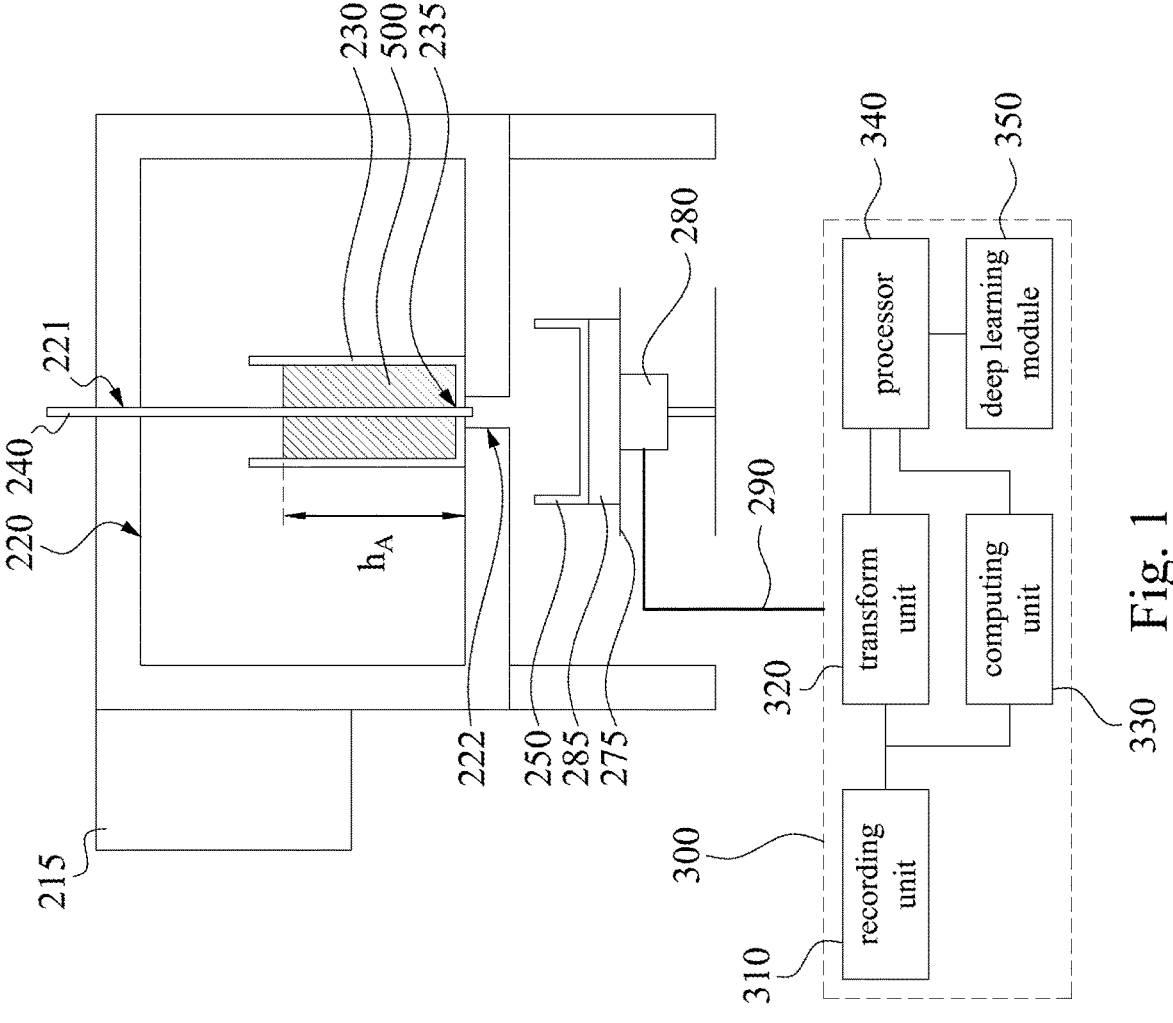
FIG. 1 illustrates a schematic view of a physical property measuring device according to one or more embodiments of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

A draining vessel method can be used for measuring physical properties of fluid. In some embodiments, a draining vessel method can include containing measured fluid by a vessel and receiving the measured fluid by a loader separated from the vessel. By measuring weight of the loader at different time points during a time period and recording weight accumulation data of the weight of the loader at the different time points, a mass flow rate (MFR) of the measured fluid flowing from the vessel to the loader can be converted from the weight accumulation data and be provided.

According, through comparing the mass flow rate of the measured fluid flowing from the vessel and a mass flow rate provided by performing a computation fluid dynamics (CFD) simulation, physical properties of the measured fluid can be obtained. The physical properties of the measured fluid can include a density, a viscosity and a surface tension of the measured fluid. Since the loader is spatially separated from the vessel, the draining vessel method cam be used for measuring measured fluid which is difficult to be measured, e.g., molten metal fluid.

An accuracy of the measurement results of the draining vessel method depends on an accuracy of the computational fluid dynamics simulation. The execution of computational fluid dynamics simulations increases the time it takes to perform the draining vessel method. In one or more embodiments of the present disclosure, computational fluid dynamics simulations can be systematically performed in advance according to different physical property parameter sets, and a deep learning model can be established through computational fluid dynamics simulation. Therefore, it is possible to efficiently save the time required for performing the measurement of the draining vessel method while maintaining the accuracy of the physical property measurement.

Figure 2:
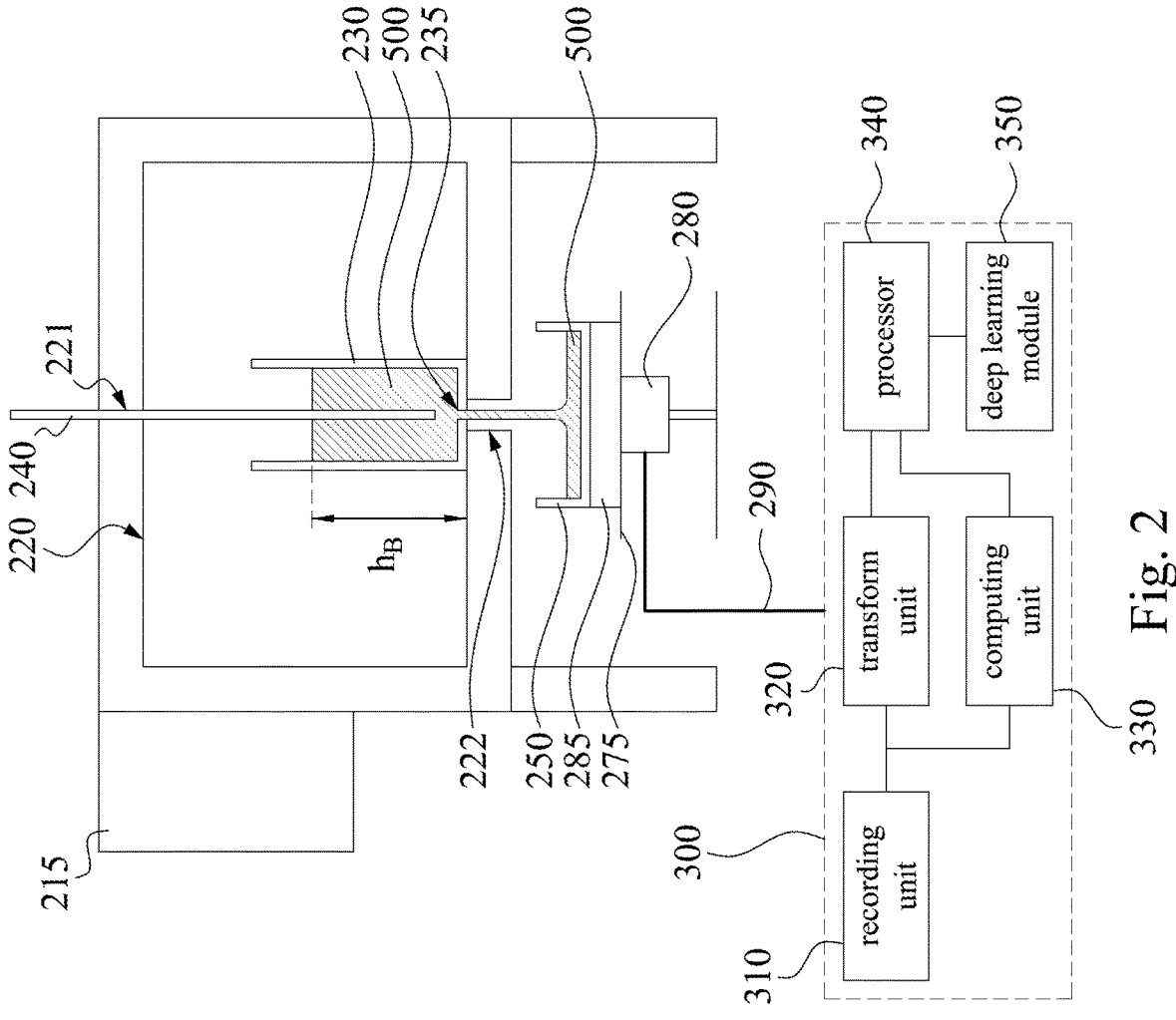
FIG. 2 illustrates a schematic diagram of measuring properties of fluid by a physical property measuring device according to one or more embodiments of the present disclosure.

Reference is made to FIG. 1 and FIG. 2 to illustrate a physical property measuring device 100 used for performing draining vessel method in one or more embodiments of the present disclosure. FIG. 1 illustrates a schematic view of a physical property measuring device 100 according to one or more embodiments of the present disclosure. FIG. 2 illustrates a schematic diagram of measuring properties of fluid 500 by a physical property measuring device 100 according to one or more embodiments of the present disclosure.

As shown in FIG. 1, in one or more embodiments of the present disclosure, a physical property measuring device includes a furnace 210, a draining vessel 230 and a loader 250. The furnace 210 includes a temperature control device 215 and a chamber 220. The draining vessel 230 is accommodated in the chamber 220 of the furnace 210. In one or more embodiments, the chamber 220 can be further provided with a door (not shown in the figure), and the chamber 220 can be sealed through the door. After the door of the furnace 210 is closed, the door and the chamber 220 form a closed space. The temperature control device 215 would then be able to control the temperature of the closed space within the chamber 220.

In one or more embodiments as an example not limiting the present disclosure, one or more heating coils used for heating can be disposed on an inner sidewall of the chamber 220 of the furnace 210. The temperature control device 215 is connected to the heating coil in the chamber 220 to control the current flowing in the heating coil, thereby increasing the temperature inside the chamber 220.

As shown in FIG. 1, the vessel 230 is configured to contain fluid 500. In this embodiment, the vessel 230 further includes an opening 235. The opening 235 is located at the bottom of the vessel 230. A stopper 240 is further disposed in the vessel 230. The stopper 240 is configured to block the opening 235 at the bottom of the vessel 230. By moving the stopper 240 away from the opening 235, it would allow the fluid 500 flow out of the vessel 230 through the opening 235. In some embodiments, the material of the stopper 240 includes ceramic or other materials that are resistant to high temperature and is not easily thermally conductive.

In FIG. 1, the measured fluid 500 occupies a height $h_A$ in the draining vessel 230.

In some embodiments of the present disclosure, the fluid 500 is, for example, an aqueous solution that is liquid at room temperature. In some embodiments of the present disclosure, the fluid 500 is, for example, a molten metal fluid. In the embodiment where the measured fluid 500 is a molten metal fluid, when the measured fluid 500 is first measured, the measured fluid 500 is not necessarily contained in the draining vessel 230 in a form of a fluid.

For example, the measured molten metal fluid 500 can be solid at normal temperature, the total weight of the solid metal can be measured first, and the solid metal can be placed and contained in the draining vessel 230 by manual placement. Subsequently, after the draining vessel 230 is placed in the chamber 220 and the door of the chamber is closed, the temperature in the sealed chamber 220 is adjusted by the temperature control device 215, so that the solid metal to be measured is melted into a molten metal fluid 500, and the molten metal fluid 500 is kept at a specified temperature.

As shown in FIG. 1, the chamber 220 further includes an upper passage 221 and a lower passage 222. The stopper 240 blocking the opening 235 of the vessel 230 extends through the upper passage 221 outside of the chamber 220 of the furnace 210. The opening 235 of the vessel 230 is aligned with the lower passage 222 to discharge the fluid 500 through the lower passage 222 outside of the chamber 220.

In one or more embodiments of this disclosure, the physical property measuring device 100 further includes a loader 250 and a scale 270. As shown in FIG. 1, in this embodiment, the scale 270 is located below the vessel 230 and the scale 270 is configured to carry the loader 250. The opening 235 of the vessel 230 is aligned with the loader 250 through the lower passage 222. Therefore, the loader 250 would be able to carry the fluid 500 flowing from the vessel 230.

In one or more embodiments of the present disclosure, the scale 270 is used as a weight measurement device, and the scale 270 is configured to measure the weight of the loader 250 in real time. In FIG. 1, the scale 270 includes a support frame 275 and a load cell 280. The load cell 280 is a force sensor used to convert the bearing pressure into an electronic signal. In FIG. 1, the support frame 275 is arranged on the load cell 280, and the loader 250 is located on the support frame 275. When the loader 250 subsequently accumulates the measured fluid, a weight of the measured fluid can be converted by the load cell 280 into electronic signal, which is transmitted through the connection line 290 connected to the load cell 280 for subsequent calculations. It should be understood that the above-mentioned scale 270 is intended as an example of an implementation, and the present disclosure does not limit to the structure of the scale 270.

As shown in FIG. 1, in this embodiment, the loader 250 has a heat insulation plate 285 between the loader 250 and the support frame 275 of the scale 270. When the temperature of the subsequent measured fluid is high, the temperature of the loader 250 carrying the measured fluid would increase. By providing a heat insulation plate 285 between the loader 250 and the support frame 275, the support frame 275 and the load cell 280 can be protected from damage due to direct exposure to high temperatures. In some embodiments, the material of the heat insulation plate 285 is, for example, polystyrene. In some embodiments, the chamber 220 can also be provided with thermal insulation material to reduce damage from unintended contact between the vessel 230 and the chamber 220 when the draining vessel 230 is placed in the chamber 220.

In this embodiment, the physical property measuring device 100 further includes a physical property computing system 300. In FIG. 1, the physical property computing system 300 is electrically connected to the load cell 280 of the scale 270 by the connection line 290 to receive weight accumulation data of the loader 250 from the load cell 280.

As shown in FIG. 1, in this embodiment, the physical property computing system 300 includes a recording unit 310, a transform unit 320, a computing unit 330, a processor 340 and a deep learning model 350. After the fluid 500 flows from the draining vessel 230 to the loader 250, the flow information of the fluid 500 can be obtained. According to fluid dynamics, the computing system 300 for physical properties can obtain the physical properties of the fluid 500 in the chamber 220 of the furnace 210 through the flow information and the related simulation calculation.

In one or more embodiments of the present disclosure, the physical property computing system 300 includes, for example, a personal computer or a server host. The recording unit 310, the transform unit 320, the computing unit 330, and the deep learning model (module) 350 are, for example, one or more functional units or databases stored on a storage device of the personal computer or server host, and execute one or more functional units or access data stored in one or more databases via the processor 340.

In one or more embodiments of the present disclosure, the recording unit 310 is configured to record vessel shape information for the draining vessel 230 within the furnace 210. Further, the recording unit 310 can also be configured to record weight accumulation data of the loader 250 as measured by the load cell 280. For example, the load cell 280 can measure the weight of the loader 250 and the fluid 500 received by the loader 250 in real time for different time points during a time period. The weight of loader 250 measured by the load cell 280 at different time points. The weight of the loader 250 and the fluid 500 received by the loader 250 measured at different time points in time would be able to be recorded by the recording unit 310 through the connection line 290.

In one or more embodiments of the present disclosure, the transform unit 320 can be configured to convert the weight accumulation data of the measured fluid 500 in the loader 250 to other physical quantities. For example, the transform unit 320 can convert the weight accumulation data of the fluid 500 to a height of the fluid 500 occupied in the draining vessel 230 by assumed physical parameters and vessel shape information. In some embodiments, the weight accumulation data of fluid 500 is a plurality of weights measured by the load cell 280 at multiple time points during a time period, and the transform unit 320 can convert multiple weights at multiple time points during a time period into multiple mass flow rates at different time points.

In one or more embodiments of the present disclosure, the computing unit 330 can be configured to perform a simulation of the fluid 500 to calculate a simulated mass flow rate of the fluid 500 at a plurality of different time points based on a physical parameter set. In one or more embodiments of the present disclosure, the computing unit 330 is configured to perform a simulation of the computational fluid dynamics based on the physical parameter set. For example, the physical parameter set includes the density, viscosity, and surface tension of the fluid 500. Accordingly, the computing unit 330 can perform the simulation of the fluid 500 by setting the density, viscosity, and surface tension to obtain a simulated mass flow rate of the fluid 500 through the opening 235 of the vessel 230.

Computational fluid dynamics is the use of numerical methods for solving fluid mechanics equations. Specifically, in some algorithms of computational fluid mechanics, the finite element method can be applied, which is able to divide the fluid system into a number of connected small volumes (or called lattices) at different locations in space, and calculate the Navier-Stokes equations for the fluid in the corresponding volume for each adjacent small volume, as well as the continuity equations for the fluid itself, so as to simulate the flow of the fluid. The continuity equations of the fluid itself are used to simulate the flow of the fluid. Computational fluid mechanics is a well-established technique. The simulation of computational fluid mechanics can be performed to accurately calculate various flow conditions of a fluid with known fluid properties. There are many off-the-shelf software programs available for constructing computing units for computational fluid dynamics computing unit 330.

As shown in FIG. 1, in this embodiment, the recording unit 310 is connected to the transform unit 320 and the computing unit 330. The recording unit 310 can provide the transform unit 320 with vessel shape information and weight accumulation data received from the load cell 280, allowing the transform unit 320 to convert mass flow rate data. The recording unit 310 can also provide the recorded vessel shape information to the computing unit 330 for the computing unit 330 to generate simulated mass flow rate data.

In the embodiment illustrated in FIG. 1, the processor 340 is connected to transform unit 320 and computing unit 330, respectively, to perform further processing of the mass flow rate data provided by transform unit 320 and the simulated mass flow rate data provided by computing unit 330. In one or more embodiments of the present disclosure, the processor 340 is configured to build a deep learning model 350 based on the simulated mass flow rate data provided by the computing unit 330, and subsequently, the mass flow rate data of the measured fluid 500 provided by the transform unit 320 can be input to the deep learning model 350 to obtain the physical properties of the measured fluid 500. In one or more embodiments of the present disclosure, the processor 340 can establish a deep learning model 350 by comparing multiple length criterions provided by the transform unit 320 and the computing unit 330. For details, please refer to following discussion.

Reference is made to FIG. 2. In the embodiment illustrated in FIG. 2, a schematic diagram of the physical property measuring device 100 measuring the physical property is provided to illustrate the flow of the fluid 500 between the vessel 230 and the loader 250 of the physical property measuring device 100 during the physical property measurement. In FIG. 2, the stopper 240 leaves the opening 235 so that the fluid 500 flows out from the vessel 230 to the loader 250 through the opening 235 and the lower passage 222 at the bottom of the chamber 220. Therefore, amount of fluid 500 in the vessel 230 is reduced and the height of the fluid 500 in the vessel 230 is reduced from the height $h_A$ to the height $h_B$.

The mass flow rate of the fluid 500 out of the vessel 230 is related to the height of the fluid 500 in the vessel 230. As shown in FIGS. 1 and 2, when the height $h_A$ occupied by the fluid 500 in the vessel 230 decreases to the height $h_B$, the fluid 500 corresponding to the reduced amount of height $h_A$ minus height hB in the vessel 230 exerts pressure on the fluid 500 in the opening 235, such that the mass flow rate of the fluid 500 out of the vessel 230 decreases as the height occupied by the fluid 500 in the vessel 230 decreases. In other words, the height $h_A$ and height $h_B$ occupied by the fluid 500 in the vessel 230 would closely affect the flow rate of the fluid 500. In one or more embodiments of the present disclosure, the height $h_A$ and height $h_B$ may be considered to be the height heads of the fluid 500 corresponding to length criterions of the fluid 500 occupying the vessel 230.

Figure 3:
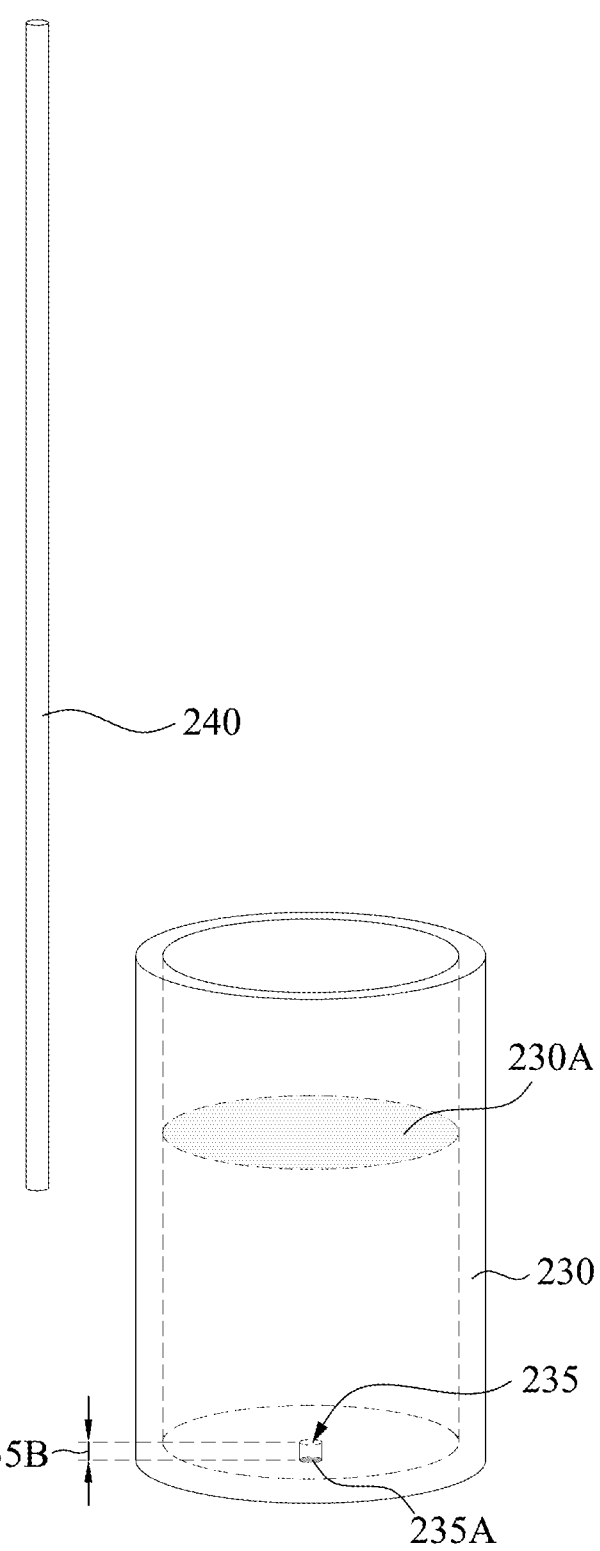
FIG. 3 illustrates perspective views of a draining vessel and a stopper according to one embodiment of present disclosure.

FIG. 3 illustrates perspective views of a draining vessel 230 and a stopper 240 according to one embodiment of present disclosure. In the embodiment illustrated in FIG. 3, the drain vessel 230 is, for example, a circular cup and has a circular opening 235 which is plugged by the stopper 240. Therefore, the draining vessel 230 has a cross-sectional area 230A, the opening 235 of the draining vessel 230 has a cross-sectional area 235A and a corresponding length 235B of the opening 235. This embodiment does not excessively limit the shape of the draining vessel and the stopper in the present disclosure.

Reference is made to FIG. 1 and FIG. 2. In one or more embodiments of the present disclosure, as the height $h_A$ occupied by the fluid 500 in the vessel 230 decreases to a height $h_B$, the pressure exerting a first portion of the fluid 500 in the opening 235 of the vessel 230 by a second portion of the fluid 500 in the vessel is reduced, wherein the first portion of the fluid 500 in the opening 235 of the vessel 230 has a volume of the cross-section area 235A multiplied by the length 235B, the second portion of the fluid 500 in the vessel 230 has a volume of the cross-section area 230A multiplied by the height $h_B$, and a reduction of the volume of the second portion of the fluid 500 in the vessel 230 is the cross-section area 230A multiplied by a height difference of the height $h_A$ and the height $h_B$ and a reduction of the pressure applying the first portion of the fluid 500 in the opening 235 is provided by the height difference of the height $h_A$ and the height $h_B$. Therefore, the mass flow rate of the fluid 500 out of the vessel 230 is reduced.

In some embodiments, the material of the draining vessel 230 includes a metal that can be heat resistant. In some embodiments, the inner wall of the draining vessel 230 in contact with the fluid 500 may include a Teflon coating, the Teflon coating having a low friction coefficient to avoid friction between the fluid 500 and the inner of the vessel 230 that would affect the flow of the fluid 500.

Figure 4:
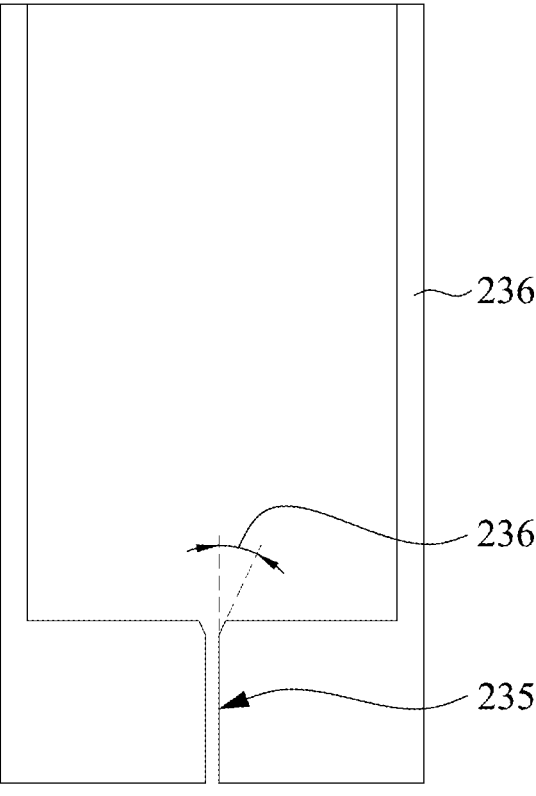
FIG. 4 illustrates a schematic cross-section view of a physical property measuring device according to one or more embodiments of the present disclosure.

FIG. 4 illustrates a schematic cross-section view of a vessel 230 of a physical property measuring device 100 according to one or more embodiments of the present disclosure. As shown in FIG. 4, in one or more embodiments of the present disclosure, a guide angle 236 is further provided at a top of the opening 235 of the vessel 230, wherein the guide angle 236 is inclined relative to the direction in which the opening 235 extends.

Therefore, once the fluid 500 is accommodated in the vessel 230 of FIG. 4 and flows out from the opening 235 of the vessel 230, the inclined guide angle 236 would be able to guide the fluid 500 to flow into the opening 235 faster and increase the flow rate of the fluid 500.

Reference is made to FIG. 5 to illustrate the operation of the physical property measurement device 100 in one or more embodiments of the present disclosure. FIG. 5 illustrates a schematic flow chart of a method 400 of measuring physical properties according to one or more embodiments of the present disclosure. In one or more embodiments of the present disclosure, the method 400 includes operations 401-407.

Reference is made to FIG. 3. In operation 401, a vessel 230 is provided and vessel shape information of the vessel 230 is recorded. In this embodiment, the vessel shape information of vessel 230 may include the cross-sectional area 230A of vessel 230, the cross-sectional area 235A and the length 235B of the opening 235 of vessel 230. In some embodiments, as shown in FIG. 4, a guide angle 236 may be provided on the opening 235 of the vessel 230. The vessel shape information of the vessel 230 may include an angle of the guide angle 236 at which the guide angle 236 is inclined relative to the extending direction of the opening 235. In one or more embodiments of the present disclosure, the vessel shape information of the vessel 230 may be recorded via the recording unit 310 of the physical property computing system 300 as illustrated in FIG. 1 and FIG. 2.

After the vessel shape information of the vessel 230 is recorded by the recording unit 310, proceeds to operation 402. In operation 402, based on several training physical property parameter sets and the vessel shape information, several simulated mass flow rate data corresponding to training physical property parameter sets is generated. The simulated mass flow rate data calculated by the computing unit 330 is used in a subsequent operation to build a deep learning model 350 of the physical property computing system 300.

In detail, in one or more implementations of the present disclosure, the computing unit 330 is, for example, a computational fluid dynamics computing unit that can be configured to perform one or more simulations of a fluid. With the vessel shape information, a model of the corresponding vessel 230 can be constructed in the physical property computing system 300.

Subsequently, the computing unit 330 can set up a plurality of fluid with different training physical parameter sets in the model of the corresponding vessel 230 and calculate the variation of the mass flow rate over time of the model outflow of the plurality of fluid with the different training physical parameter sets of the corresponding vessel 230. Specifically, each of training physical parameter sets may include a density $\rho_i$, a viscosity $\eta_j$, and a surface tension $\sigma_k$ of the fluid, wherein different indexes i correspond to different values of densities, different indexes j correspond to different values of viscosities, and different indexes k correspond to different values of surface tensions. Once the computing unit 330 takes into account that the fluid with density $\rho_i$, viscosity $\eta_j$ and surface tension $\sigma_k$ is set in the model of the corresponding vessel 230 to perform the simulation of the computational fluid dynamics, it is possible to obtain the training flow rate function $MFR_{ijk}(t)$ for the flow of the fluid with density $\rho_i$, viscosity $\eta_j$ and surface tension $\sigma_k$ out of the vessel 230, wherein the training flow rate function $MFR_{ijk}(t)$ is a function of different time points, and different densities $\rho_i$, viscosities $\eta_j$, and surface tensions $\sigma_k$ result in different training flow rate functions $MFR_{ijk}(t)$. In operation 402, the training flow rate function $MFR_{ijk}(t)$ and the corresponding training physical parameters set including density $\rho_i$, viscosity $\eta_j$, and surface tension $\sigma_k$ would later be used as the feature vectors for training the deep learning model 350.

In other words, in the operation 402, under the model of the corresponding vessel 230, the computing unit 330 can calculate the training flow rate function $MFR_{ijk}(t)$ for a plurality of flows having different densities $\rho_i$, viscosities $\eta_j$ and surface tensions $\sigma_k$. Further, after deriving the training flow rate function $MFR_{ijk}(t)$, the time point t of training flow rate function $MFR_{ijk}(t)$ can be substituted into a plurality of different time points $t_0, t_1, \ldots, t_f$ to obtain a plurality of the training flow rate functions $MFR_{ijk}(t_0)$, $MFR_{ijk}(t_1)$, $\ldots$, $MFR_{ijk}(t_0)$, $MFR_{ijk}(t_1)$, $\ldots$, and $MFR_{ijk}(t_f)$ forming a set used to simulate the mass flow rate data.

In some embodiments, time point $t_0$ is set, for example, to the first second and time point $t_f$ is set, for example, to the third hundredth second, so that time point $t_0$ to time point $t_f$ is a plurality of fetches between the first second and the third hundredth second. For example, the value can be taken every second between the first second and the third hundredth second.

In one or more embodiments of the present disclosure, the training flow rate function $MFR_{ijk}(t)$ can be averaged over a set time interval during a time period from $t=t_0$ to $t=t_f$. For example, the averaged training flow rate function value $AvMFR_{ijk}(t_0)$ can be defined as an average value of the training flow rate function values $MFR_{ijk}(t=0)$, $MFR_{ijk}(t=0.01)$, $MFR_{ijk}(t=0.02)$, $\ldots$, and $MFR_{ijk}(t=1=t_1)$. The averaged training flow rate function $AvMFR_{ijk}(t)$ is established and can be used to replace the training flow rate function $MFR_{ijk}(t)$.

For the purpose of illustration, these training flow rate functions/averaged training flow rate functions obtained through the computing unit 330 are summarized in the description of the subsequent operation as $MFR_{ijk}(t)$.

In operation 403, the deep learning model 350 is trained by the processor 340 based on a training data set, wherein input feature vectors of the training data set include simulated mass flow rate data and output feature vectors of the training data set include a training physical property parameter set. For the purpose of illustration, one of the input feature vectors and the output feature vectors of the training data set in operation 403 are provided below.

The input feature vectors of the training data set include a set of the training flow rate function $MFR_{ijk}(t)$ at different time points $t_0, t_1, \ldots t_f$, wherein the set of the training flow rate function $MFR_{ijk}(t)$ at different time points $t_0, t_1, \ldots t_f$ includes a number of the training flow rate function value $MFR_{ijk}(t=t_0)$, $MFR_{ijk}(t=t_1), \ldots, MFR_{ijk}(t=t_f)$. The output feature vectors of the training data set include a training physical property parameter set corresponding to the training flow rate function $MFR_{ijk}(t)$, wherein the training physical property parameter set corresponding to the training flow rate function $MFR_{ijk}(t)$ includes a density $\rho_i$, a viscositiy $\eta_j$ and a surface tension $\sigma_k$. In other words, the set of the training flow rate function value $MFR_{ijk}(t=t_0)$, $MFR_{ijk}$ $(t=t_1), \ldots, MFR_{ijk}(t=t_f)$ with indexes i, j and k corresponds to the set of the density $\rho_i$, a viscositiy $\eta_j$ and a surface tension $\sigma_k$.

In one or more embodiments of the present disclosure, the computing unit 330 can perform simulations of the computational fluid dynamics for a plurality of different sets of densities $\rho_i$, viscosities $\eta_j$ and surface tensions $\sigma_k$ to obtain a plurality of different sets of the training flow rate function values $MFR_{ijk}(t=t_0)$, $MFR_{ijk}(t=t_1), \ldots,$ and $MFR_{ijk}(t=t_f)$. Any pf the density $\rho_i$, viscosity $\eta_j$ and surface tension $\sigma_k$ can be varied in a selected range.

For example, but not limited to, in some embodiments of the present disclosure, the densities $\rho_i$ can be a $n_i$ numbers of values in a density range of 700 kg/m² to 1900 kg/m², the viscosities $\eta_j$ can be nj numbers of values in a viscosity range of 0.5 cP to 14.0 cP, and the surface tension $\sigma_k$ can be $n_k$ number of values in a surface tension range of 30 mN/m to 100 mN/m. Therefore, $n_i$ value multiplied by $n_j$ value and $n_k$ value of numbers of the input feature vectors and $n_i$ value multiplied by $n_j$ value and $n_k$ value of numbers of the output feature vectors are constructed, wherein each input feature vector with a specific set of indexes I, j and j includes a set of training mass flow rate values $MFR_{ijk}(t=t_0)$, $MFR_{ijk}$ $(t=t_1), \ldots, MFR_{ijk}(t=t_f)$ and each output feature vector with the corresponding set of indexes I, j and j includes the density $\rho_i$, viscosity $\eta_j$ and surface tension $\sigma_k$. The density range of the density $\rho_i$, the viscosity range of viscosity $\eta_j$ and the surface tension range of the surface tension $\sigma_k$ response possible density $\rho_i$, viscosity $\eta_j$ and surface tension $\sigma_k$ of the measured fluid 500.

In one or more embodiments of the present disclosure, in operation 403, the input feature vector including a plurality of different sets of training flow rate function values $MFR_{ijk}$ $(t=t_0)$, $MFR_{ijk}(t=t_1), \ldots$ corresponding to different indexes i, j, and k and the output feature vector including a plurality of training physical property parameter set, each of which includes a corresponding density $\rho_i$, a viscosity $\eta_j$ and a surface tension $\sigma_k$ are configured as $n_i$ value multiplied $n_j$ value and $n_k$ value numbers of the training data sets to build the artificial neural network (ANN) of the deep learning model 350. In other words, one or more hidden layers can be set between the input layer of the deep learning model 350 (trained with multiple sets of different training flow rate function values $MFR_{ijk}(t=t_0)$, $MFR_{ijk}(t=t_1), \ldots$)) and the output layer (trained with multiple sets of training physical parameters including density $\rho_i$, viscosity $\eta_j$ and surface tension $\sigma_k$) to further increase the accuracy of the deep learning model 350. In some embodiments, the construction of artificial neural networks can be achieved, for example, through machine learning software libraries such as TensorFlow or XGBoost.

In summary, in operation 403, the processor 340 can be configured to build a deep learning model 350 by calculating the sets of training flow rate functions $MFR_{ijk}(t)$ calculated by the computing unit 330 based on the vessel shape information of vessel 230 and the training physical property parameter sets including density $\rho_i$, viscosity $\eta_j$, and surface tension $\sigma_k$, wherein the training data sets of the deep learning model 350 include a plurality of input feature vectors and a plurality of output feature vectors. One of the input feature vectors of the training data set is the sets of multiple training flow rate function values $MFR_{ijk}(t)$ at different time points $t_0, t_1, \ldots, t_f$. The corresponding one of the output feature vectors of the training data set are the corresponding one of the training physical parameter sets including density $\rho_i$, viscosity $\eta_j$, and surface tension $\sigma_k$. Therefore, the trained deep learning model 350 cane take a set of input flow rate function values as the input feature vectors to out a corresponding physical parameter set as the output feature vector, which would include a corresponding density, viscosity and surface tension.

In one or more embodiments of the present disclosure, after the computing unit 330 provides a plurality of training physical parameter sets including densities $\rho_i$, viscosities $\eta_j$, and surface tensions $\sigma_k$ and a corresponding plurality of sets of training flow rate function values $MFR_{ijk}(t)$, the processor 340 may randomly select some of the sets of training flow rate function values $MFR_{ijk}(t)$ and the corresponding some training physical parameter sets as the input feature vectors and output feature vectors for a validation set of the deep learning model 350. After the deep learning model 350 is trained with the training data set, the input feature vectors of the validation set are then input to the trained deep learning model 350 to verify whether the output feature vectors of the trained deep learning model 350 are consistent with the output feature vectors of the validation set, thus ensuring the accuracy and reliability of the trained deep learning model 350. After the training of the deep learning model 350 is completed, the physical property computing system 300 is establish as illustrated in FIG. 1 and FIG. 2.

Reference is made to FIG. 1 and FIG. 2. Proceed to operation 404 to receive the measured fluid 500 from the opening 235 of the vessel 230 by the loader 250. In FIG. 2, the stopper 240 is removed from the opening 235 of the vessel 230 so that the fluid 500 flows from the vessel 230 through the opening 235 to the loader 250, and the fluid 500 occupies a height $h_B$ in the vessel 230 and the height $h_B$ is less than the height $h_A$.

In one or more embodiments of the present disclosure, the measured fluid 500 is, for example, a molten metal fluid. In operation 404, the metal solids corresponding to the measured fluid 500 can be carried in the vessel 230 and subsequently heated in the chamber 220 by the furnace 210, causing the metal solids to melt into the measured fluid 500 and housed in the vessel 230.

Continuing with operation 404, in operation 405, weight accumulation data w(t) of weight of the loader 250 relative to different time points t in a time period is measured by the load cell 280 of the scale 270. The weight accumulation data of the loader 250 measured by the load cell 280 is transmitted to the physical property computing system 300 and recorded by the recording unit 310. In this embodiment, the weight accumulation data w(t) is a function of the relative different time points t.

In operation 406, a mass flow rate data of the measured fluid 500 is obtained by the transform unit 320 based on the measured weight accumulation data. In some embodiments, the transform unit 320 can differentiate the weight accumulation data w(t) by means of data differentiation to obtain the measured mass flow rate function tMFR(t) for the flow of the fluid 500 out of the vessel 230. Since the weight of the loader 250 itself remains constant, the effect of the loader 250 in the measured mass flow rate function tMFR(t) to be measured is eliminated.

In one or more embodiments of the present disclosure, a plurality of time points $t_0, t_1, \ldots, t_f$ can be substituted to the measured mass flow rate function tMFR(t) to obtain a plurality of mass flow rate function values tMFR($t_0$), tMFR($t_1$), . . . , tMFR($t_f$). The set of the mass flow rate function value values tMFR($t_0$), tMFR($t_1$), . . . , tMFR($t_f$) of the measured mass flow rate function tMFR(t) would be used as the mass flow rate data for the measured fluid 500.

In operation 407, the measured mass flow rate data is input to the trained deep learning model 350 to obtain the measured physical property parameters of the measured fluid 500. In this embodiment, the set of the mass flow rate functions tMFR($t_0$), tMFR($t_1$), . . . , tMFR($t_f$) can be input as input feature vectors to the deep learning model 350, so that the deep learning model 350 outputs output feature vectors, which are the measured physical parameter set corresponding to the measured fluid 500, and the measured physical parameter set includes density ρ, viscosity η and surface tension σ corresponding to the measured fluid 500.

Accordingly, for a vessel 230 with specific vessel shape information, it is possible to generate a plurality of corresponding training mass flow rate data $MFR_{ijk}(t)$ for a plurality of training physical parameter sets including different densities $\rho_i$, viscosities $\eta_j$ and surface tensions $\sigma_k$ in operation 402 and operation 403 in advance through the computing unit 330, and to train the deep learning model 350 through the plurality of training physical parameter sets and the corresponding mass flow rate data. Subsequently, when a measurement of the measured physical properties of the fluid 500 a performed in operations 404 to 407, the deep learning model 350 would be able to quickly obtain the corresponding measured physical property parameters set of the fluid 500, wherein the corresponding measured physical property parameters set includes a density ρ, a viscosity η and a surface tension σ corresponding to the measured fluid 500.

In one or more embodiments of the present disclosure, the deep learning model 350 is built by calculating the mass flow rate data $MFR_{ijk}(t)$ generated by the density $\rho_i$, viscosity $\eta_j$ and surface tension $\sigma_k$ in possible and reasonable ranges by the computing unit 330. The establishment of the deep learning model 350 can be regarded as a collection of physical parameter sets of the possible density $\rho_i$, viscosity $\eta_j$ and surface tension $\sigma_k$ corresponding to the different pre-calculated mass flow rate data. Therefore, the deep learning model 350 can achieve fast matching of the measured mass flow rate to a corresponding one of the physical parameter sets. Once a measured mass flow rate data of the measured fluid 500 is obtained from the vessel 230, the loader 250 and the scale 270 of the physical property measuring device 100, the measured mass flow rate data can be input into the deep learning model 350 to quickly match the density ρ, viscosity η and surface tension σ of the measured fluid 500.

In one or embodiment, a number of the established deep learning model is greater than one. For the purpose of illustration, only one of the deep learning models 350 is illustrated in FIG. 1 and FIG. 2.

For example, in one or more embodiments of the present disclosure, the density range that can be set for the density $\rho_i$ can be further divided into a low density range, a medium density range and a high density range for a total of three ranges. Similarly, the viscosity range that can be set for the viscosity $\eta_j$ can be divided into a low viscosity range, a medium viscosity range, and a high viscosity range for a total of three ranges. The surface tension range that can be set for the surface tension $\sigma_k$ can be divided into three ranges including a low surface tension range, a medium surface tension range and high surface tension range. This makes it possible to build a total of twenty-seven deep learning models 350 for each of the three ranges of density $\rho_i$, the three ranges of viscosity $\eta_j$, and the three ranges of surface tension $\sigma_k$.

Therefore, if the corresponding density ρ, viscosity η and surface tension σ of the measured fluid 500 are obtained in advance by other types of measurements, the corresponding one can be selected from the multiple deep learning models 350 to input the measured flow rate data, and a more accurate measured physical parameters set can be obtained.

In one or more embodiments of the present disclosure, the training mass flow rate data $MFR_{ijk}(t)$ of the training data set of the trained deep learning model 350 is a function of different time points t. In some embodiments of the present disclosure, the training mass flow rate data can be replaced with the training mass flow rate data $MFR_{ijk}(h(t))$ as a function of the mass flow rate relative to the height head, and the deep learning model 350 can be trained by using the training mass flow rate data $MFR_{ijk}(h(t))$ as a function of the mass flow rate relative to the height head as the input feature vector of the training data set.

The height head h(t) is a function of different time points t, for example, corresponding to the height $h_A$ of the fluid 500 in FIG. 1 and the height $h_B$ of the fluid in FIG. 2. As mentioned previously, the height head h(t) is closely related to the mass flow rate of the fluid 500, so in some embodiments training the deep learning model 350 based on the training mass flow rate data $MFR_{ijk}(h(t))$ with respect to the height head h(t) would be advantageous for improving the prediction accuracy of the trained deep learning model 350.

In some embodiments, the measured flow rate data tMFR(t) of the fluid 500 can be recorded by the recording unit 310, and the corresponding height head h(t) of the fluid 500 can be converted by the transform unit 320, so as to build the training mass flow rate data $MFR_{ijk}(h(t))$, which is a function of the mass flow rate relative to the height head, as the input feature vector of the training data set for training the deep learning model 350.

Reference is made to FIG. 6 to further illustrate an aspect of operations of a physical property measuring device 100. FIG. 6 illustrates a schematic flow chart of a method 600 of measuring physical properties according to one or more embodiments of the present disclosure. In this embodiment, the method 600 includes operations 601-614.

Reference is made to FIG. 3. In operation 601, a vessel 230 is provided and vessel shape information of the vessel 230 is recorded. In this embodiment, the vessel shape information of the vessel 230 may include the cross-sectional area 230A of vessel 230, the cross-sectional area 235A and the length 235B of the opening 235 of vessel 230. In some embodiments, as shown in FIG. 4, the opening 235 of the vessel 230 may be provided with a guide angle 236. The vessel shape information of the vessel 230 may include an angle of the guide angle 236 at which the guide angle 236 is inclined relative to the extending direction of the opening 235. In one or more embodiments of the present disclosure, the vessel shape information of the vessel 230 may be recorded by the recording unit 310 of the physical property computing system 300 as illustrated in FIG. 1 and FIG. 2.

Figure 7:
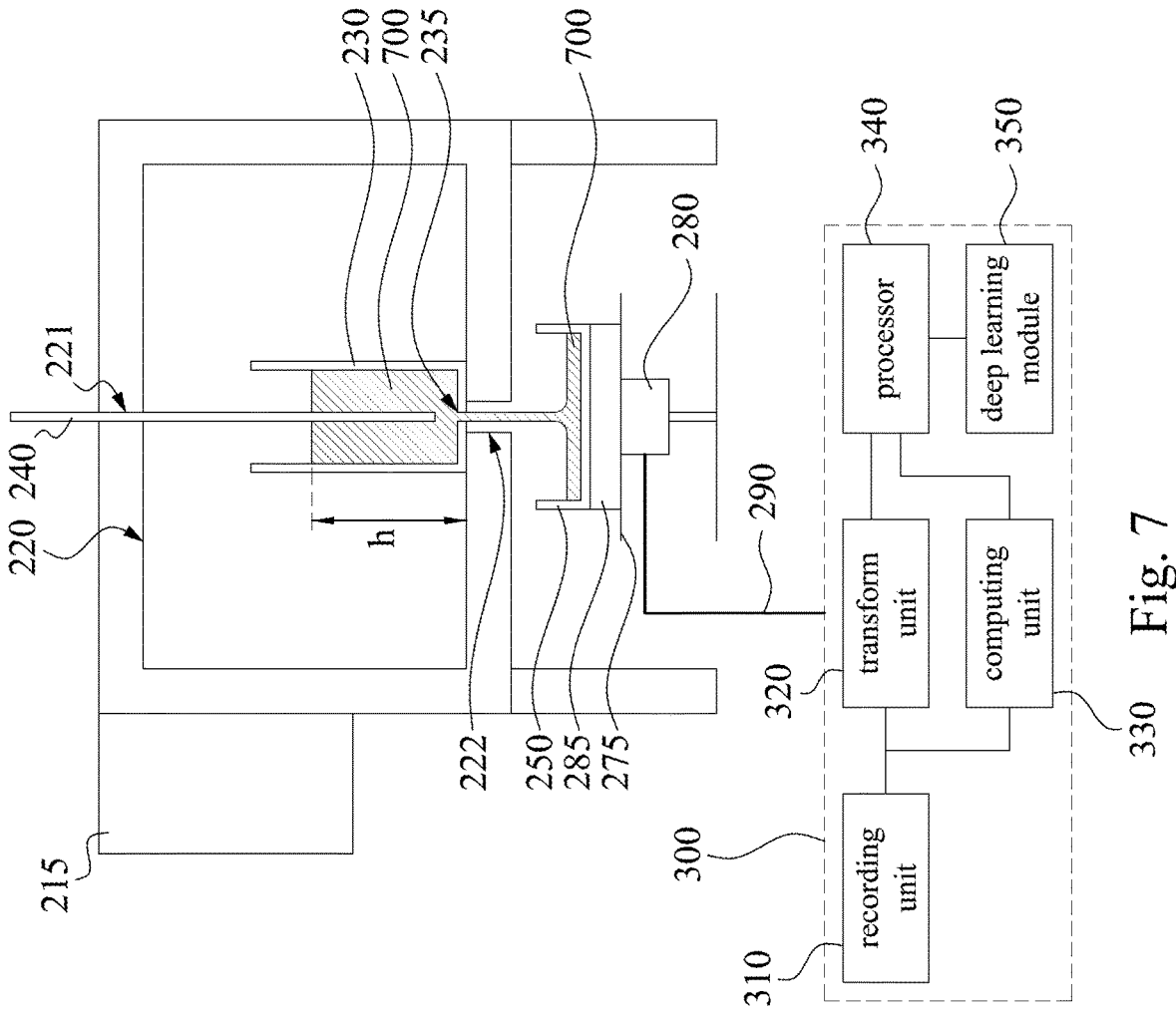
FIG. 7 illustrates a schematic diagram showing the measurement of the physical properties of the fluid in the method of measuring physical properties shown in FIG. 6.

Reference is made to FIG. 7. FIG. 7 illustrates a schematic diagram showing the measurement of the physical properties of the fluid 500 in the method 600 of measuring physical properties shown in FIG. 6. In one or more embodiments of the present disclosure, as shown in FIG. 7, the fluid 700 other than the measured fluid 500 is carried in a vessel 230. In one or more embodiments of the present disclosure, in method 600, the properties of one or more fluid 700 other than the measured fluid 500 are measured in advance of measuring the properties of the measured fluid 500, and the physical property parameters and corresponding mass flow rate data are used to train a deep learning model 350. For details, please refer to operations 602-609.

In operation 602, weight accumulation data of the fluid 700 flowing from the vessel 230 to the loader 250 is measured by the load cell 280 of the scale 270. In FIG. 7, by moving the stopper 240 from the opening 235, the fluid 700 contained in the vessel 230 flows through the opening 235 to the loader 250, and the weight accumulation data w(t) of the loader 250 and the fluid 700 carried by the loader 250 is subsequently measured by the load cell 280. The recording unit 310 can be configured to record the weight accumulation data w(t).

In operation 603, the mass flow rate data MFR(t) of the fluid 700 is generated based on the weight accumulation data w(t). In this embodiment, the mass flow rate data MFR(t) can be obtained by numerically differentiating the weight accumulation data w(t) by the transform unit 320.

In operation 604, the physical property computing system 300 would first provide a predicted physical parameter set for subsequent calculations and comparisons. Specifically, in this embodiment, the predicted physical parameters of the fluid 700 include density $\rho_0$, viscosity $\eta_0$, and surface tension $\sigma_0$.

Then, proceed to operation 605. In operation 605, the weight accumulation data w(t) is convert into a first length criterion occupied by the fluid 700 in the vessel 230 based on a predicted physical parameter set of predicted density $\rho_0$, viscosity $\eta_0$ and surface tension $\sigma_0$ and the vessel shape information. As shown in FIG. 7, in this embodiment, the first length criterion is the first height head $h_1(t; \rho_0, \eta_0, \sigma_0)$ occupied by the fluid 700 in the vessel 230 corresponding to the height h occupied by the fluid 700 in the vessel 230. In some embodiments, the predicted density $\rho_0$, viscosity $\eta_0$ and surface tension $\sigma_0$ are not necessarily the same as the exact properties to be obtained. In some embodiments, the predicted density $\rho_0$, viscosity $\eta_0$ and surface tension $\sigma_0$ can be predicted with reference to existing literature, which would further reduce the calculation time of the physical property computing system 300.

Specifically, in the operation 605, the transform unit 320 can convert the weight w(t) of the molten metal fluid into the volume of the fluid 700 accumulated in the loader 250 by using the predicted density $\rho_0$, viscosity $\eta_0$ and surface tension $\sigma_0$ provided by the physical property computing system 300. On the basis that the total weight of the fluid 700 can be obtained by weighing prior to the physical property measurement and based on the volume of the fluid 700 accumulated in the loader 250 relative to different time points t in a time period, the first height head of the fluid 700 in the draining vessel 230 can be presented as first height head $h_1(t; \rho_0, \eta_0, \sigma_0)$ function relative to different time points t.

In operation 606, the computing unit 330 simulates the flow of the fluid 700 by the predicted physical parameter set including density $\rho 0$, viscosity $\eta_0$ and surface tension $\sigma 0$ and the vessel shape information to obtain a second length criterion occupied by the fluid 700 in the vessel 230. In this embodiment, the second length criterion is the second height head of the fluid 700 in the vessel 230 obtained by the computing unit 330 through a computational fluid dynamics algorithm. As mentioned above, given the predicted physical parameter set (including density $\rho_0$, viscosity $\eta_0$ and surface tension $\sigma_0$) and the vessel shape information of vessel 230 (including cross-sectional area 230A of vessel 230 and cross-sectional area 235A and length 235B of opening 235 of vessel 230), the height of fluid 700 in vessel 230 at different time points t can be obtained by the computational fluid dynamics algorithm. The height of fluid 700, obtained by the computational fluid dynamics algorithm, in vessel 230 at different time points t is the second height $h_2(t; \rho_0, \eta_0, \sigma_0)$ function.

In operation 607, a difference function is calculated from the difference between the first length criterion and the second length criterion, wherein the first height head $h_1(t; \rho_0, \eta_0, \sigma_0)$ is obtained in operation 605 and the second height head $h_2(t; \rho_0, \eta_0, \sigma_0)$ is obtained in operation 606. The processor 340 of the physical property computing system 300 would establish the difference function $\Delta(t; \rho_0, \eta_0, \sigma_0)$ from the first height head $h_1(t; \rho_0, \eta_0, \sigma_0)$ and the second height head $h_2(t; \rho_0, \eta_0, \sigma_0)$.

For example, both the first height head $h_1(t; \rho_0, \eta_0, \sigma_0)$ and the second height head $h_2(t; \rho_0, \eta_0, \sigma_0)$ are functions of time points t. Therefore, a difference between the first height head $h_1(t; \rho_0, \eta_0, \sigma_0)$ and the second height head $h_2(t; \rho_0, \eta_0, \sigma_0)$ can be expressed as a squared difference as $(h_1(t; \rho_0, \eta_0, \sigma_0) - h_2(t; \rho_0, \eta_0, \sigma_0))^2$. Therefore, in operation 607, the difference function $\Delta(t; \rho_0, \eta_0, \sigma_0)$ can be expressed as a sum of squared differences of the first height head $h_1(t; \rho_0, \eta_0, \sigma_0)$ and the second height head $h_2(t; \rho_0, \eta_0, \sigma_0)$ at many different time points $t_0, t_1, \ldots, t_f$. In this embodiment, the difference function $\Delta(t; \rho_0, \eta_0, \sigma_0)$ of the first height head $h_1(t; \rho_0, \eta_0, \sigma_0)$ and the second height head $h_2(t; \rho_0, \eta_0, \sigma_0)$ can be established by the processor 340.

Following operation 607, in operation 608, confirm whether the difference function $\Delta(t; \rho_0, \eta_0, \sigma_0)$ is minimized. In this embodiment, the processor 340 is configured to deal with a standard optimization problem that whether the difference function $\Delta(t; \rho_0, \eta_0, \sigma_0)$ is minimized under the predicted physical parameters density $\rho_0$, viscosity $\eta_0$, and surface tension $\sigma_0$. If not, the operation is returned to operation 604 to reset a new predicted physical parameter set including new density $\rho_1$, viscosity $\eta_1$ and surface tension $\sigma_1$ which are different from the density $\rho_0$, viscosity $\eta_0$ and surface tension $\sigma_0$. The condition to determine whether the difference function $\Delta(t; \rho_0, \eta_0, \sigma_0)$ is minimized can be set in advance to obtain the desired accuracy. For example, it is possible to determine whether the difference function $\Delta(t; \rho_0, \eta_0, \sigma_0)$ is smaller than a determined value. For a new set of iterations of the predicted physical parameters $\rho_1, \eta_1$ and $\sigma_1$, a difference between $\Delta(t; \rho_0, \eta_0, \sigma_0)$ and $\Delta(t; \rho_1, \eta_1, \sigma_1)$ can be determined to be less than a determined value, and if so, the difference function $\Delta(t; \rho_1, \eta_1, \sigma_1)$ is considered to be minimized. If the difference function $\Delta$ is minimized, the predicted physical parameter set that minimizes the difference function $\Delta$ is selected as the physical parameter set of the fluid 700 in operation 609.

In operation 610, the deep learning model 350 is trained by the processor 340 based on a training data set, wherein the input feature vector of the training data set includes mass flow rate data and the output feature vector of the training data set includes the physical parameter sets. For the purpose of illustration, one of the input feature vectors and the output feature vectors of the training data set in operation 610 are provided below.

The input feature vectors of the training data set include the sets of flow rate functions $MFR_{ijk}(t)$ at many different time points $t_0$, $t_1$, . . . , $t_f$ i.e., flow rate function values $MFR_{ijk}(t=t_0)$, $MFR_{ijk}(t=t_1)$, . . . , $MFR_{ijk}(t=t_f)$. The output feature vectors of the training data set include the set of physical parameters of the fluid corresponding to the flow rate function $MFR_{ijk}(t)$, i.e., density $\rho_i$, viscosity $\eta_j$ and surface tension $\sigma_k$. In other words, a input feature vector of the set of flow rate function values $MFR_{ijk}(t=t_0)$, $MFR_{ijk}$ $(t=t_1)$, . . . , $MFR_{ijk}(t=t_f)$ corresponds to a set of the density $\rho_i$, viscosity $\eta_j$ and surface tension $\sigma_k$ of one of the actual measured fluids 700.

In one or more embodiments of the present disclosure, the density range of density $\rho_i$, the viscosity range of viscosity $\eta_j$, and the surface tension range of surface tension $\sigma_k$ are set based on the density, viscosity, and surface tension obtained from the actual measurement of the multiple fluid in operation 602 to operation 609.

After the training of the deep learning model 350 is completed, the trained deep learning model 350 of the physical property computing system 300 is built as shown in FIG. 1 and FIG. 2. It should be noted that since the deep learning model 350 of operation 610 is built based on the vessel shape information of vessel 230, the vessel 230 must be selected for the vessel of the physical property measuring device 100.

In operation 612, the measured weight accumulation data w(t) is measured by the load cell 280 of the scale 270 with respect to the weight of the loader 250 at different time points t in a time period. The measured weight accumulation data measured by the load cell 280 of the loader 250 is transmitted to the physical property computing system 300 and recorded by the recording unit 310. In this embodiment, the weight accumulation data w(t) is a function of the relative different time points t.

In operation 613, the measured mass flow rate data of the measured fluid 500 is obtained by the transform unit 320 based on the measured weight accumulation data. In some embodiments, the transform unit 320 can differentiate the measured weight accumulation data w(t) by means of data differentiation to obtain the measured mass flow rate function tMFR(t) for the flow of the fluid 500 out of the vessel 230. In one or more embodiments of the present disclosure, a plurality of time points $t_0$, $t_1$, . . . , $t_f$ can be substituted into the measured mass flow rate function tMFR(t) to obtain a plurality of mass flow rate function values $tMFR(t_0)$, $tMFR$ $(t_1)$, . . . , $tMFR(t_f)$, these values of the mass flow rate functions $tMFR(t_0)$, $tMFR(t_1)$ forming a set used as the measured mass flow rate data of the measured fluid 500.

In operation 614, the measured mass flow rate data is input to the deep learning model 350 to obtain the measured physical property parameter set of the measured fluid 500. In this embodiment, the set pf the mass flow rate function values $tMFR(t_0)$, $tMFR(t_1)$, . . . , $tMFR(t_f)$ is used as an input feature vector to the deep learning model 350, such that the deep learning model 350 outputs an output feature vector, wherein the output feature vector is a measured physical parameter set corresponding to the fluid 500. The measured physical parameter set includes density $\rho$, viscosity $\eta$ and surface tension $\sigma$ corresponding to the fluid 500.

Therefore, in the method 600 of measuring the physical properties of a fluid, one or more sets of physical properties parameters of the fluid 700 can be measured by performing the draining vessel method in advance, and the deep learning model 350 can be trained by using the mass flow rate data of these actual measured fluids with the corresponding physical property parameter set. When the measured flow rate data of the measured fluid 500 is provided, the measured flow rate data of the fluid 500 can be input to the deep learning model 350 to quickly obtain the measured physical parameter set of the fluid 500 by the deep learning model 350, wherein the measured physical parameter set of the fluid 500 includes the density $\rho$, viscosity $\eta$ and surface tension $\sigma$ of the measured fluid 500.

In summary, in one or more embodiments of the present disclosure, the deep learning model can be trained based on simulated mass flow rate data and corresponding physical parameter set obtained by computational fluid dynamics for the fluid contained in the vessel in the physical property measuring device, or the deep learning model can be trained based on the mass flow rate data and the corresponding physical parameter set actually measured by performing the draining vessel method. For the measured fluid in a specific vessel in the physical property measuring device, the measured mass flow rate data of the measured fluid can be obtained as an input feature vector and input to the deep learning model to quickly perform the measurement of the draining vessel method to obtain the corresponding measured physical property parameter set of the measured fluid. Therefore, it is not necessary to rely on assuming the properties or a large number of iterative calculation steps to approximate the physical properties of the measured fluid, and it significantly reduces the measurement time of the draining vessel method. By building a deep learning model from a large amount of mass flow rate data and the physical parameter set, it is possible to further increase the accuracy of the obtained physical properties while significantly reducing the time required for the measurement of physical properties by the draining vessel method by avoiding the concern that the range of parameters considered in the physical parameter set is insufficient.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of measuring physical properties, comprising:

generating a plurality of simulated mass flow rate data corresponding to a plurality of training physical property parameter sets by a computing unit based on the training physical property parameter sets and a vessel shape information;

training a deep learning model by a processor based on a training data set, wherein an input feature vector of the training data set comprises the simulated mass flow rate data and an output feature vector of the training data set comprises the training physical property parameter sets;

containing a measured metal in a vessel corresponding to the vessel shape information, wherein the vessel is opaque and accommodated in a furnace;

heating the measured metal to a determined temperature by the furnace, so that the measured metal is melted into a molten metal fluid as a measured fluid;

receiving the measured fluid by a loader through an opening of the vessel;

measuring a weight accumulation data of a weight of the loader by a scale during a time period;

obtaining a measured mass flow rate data of the measured fluid based on the weight accumulation data; and inputting the measured mass flow rate data to the deep learning model to obtain a measured physical property parameter set of the measured fluid.

2. The method of claim 1, wherein the training physical property parameter sets comprises a plurality of densities, a plurality of viscosities and a plurality of surface tensions, the measured physical property parameter set comprises a measured density, a measured viscosity and a measured surface tension.

3. The method of claim 1, wherein the vessel shape information comprises a cross-section area of the vessel, a cross-section area of the opening of the vessel and a length of the opening of the vessel.

4. The method of claim 1, wherein the computing unit is a computational fluid dynamics unit, generating the simulated mass flow rate data corresponding to the training physical property parameter sets comprises:

performing a simulation of a computational fluid dynamics algorithm by the computing unit to obtain the simulated mass flow rate data.

5. The method of claim 1, wherein the simulated mass flow rate data comprises a plurality of simulated mass flow rates with respect to a plurality of time points and/or with respect to a plurality of height heads, the height heads are a plurality of fluid height of the measured fluid in the vessel from a simulation performed by the computing unit.

6. The method of claim 1, wherein a guide angle is provided at a top of the opening of the vessel.

7. The method of claim 1, wherein the vessel is spatially separated from the loader.

8. A method of measuring physical properties, comprising:

providing a vessel and recording a vessel shape information of the vessel;

training a deep learning model by a processor, comprising:

measuring a weight accumulation data of a weight of a fluid flowing from the vessel to a loader during a time period by a scale;

generating a mass flow rate data of the fluid based on the weight accumulation data;

converting the weight accumulation data into a first length criterion occupied by the fluid in the vessel through a predicted property parameter set and the vessel shape information;

simulating a flow of the fluid based on the predicted property parameter set and the vessel shape information to obtain a second length criterion occupied by the fluid in the vessel;

calculating a difference function based on a difference between the first length criterion and the second length criterion;

adjusting the predicted property parameter set to minimize the difference function, wherein the predicted property parameter set is selected as a physical property parameter set of the fluid when the difference function is minimized; and training the deep learning model through a training data set, wherein an input feature vector of the training data set comprises the mass flow rate data and an output feature vector of the training data set comprises the physical property parameter set;

containing a measured metal in the vessel, wherein the vessel is opaque and accommodated in a furnace;

heating the measured metal to a determined temperature by the furnace, so that the measured metal is melted into a molten metal fluid as a measured fluid;

receiving the measured fluid flowing out from an opening of the vessel by the loader;

measuring a measured weight accumulation data of a weight of the loader receiving the measured fluid relative to a plurality of time points by the scale;

obtaining a measured mass flow rate data of the measured fluid based on the measured weight accumulation data; and inputting the measured mass flow rate data to the deep learning model to obtain a measured physical property parameter set of the measured fluid.

9. The method of claim 8, wherein simulating the flow of the fluid based on the predicted property parameter set and the vessel shape information to obtain the second length criterion occupied by the fluid in the vessel comprises:

performing a simulation of a computational fluid dynamics algorithm to obtain the second length criterion.

10. The method of claim 8, wherein the first length criterion is a first height head obtained by converting the weight accumulation data into a first fluid height of the fluid in the vessel, and the second length criterion is a second height head obtained by simulating a second fluid height of the fluid in the vessel.

11. The method of claim 10, wherein the first height head and the second height head are functions relative to the time points.

12. The method of claim 8, wherein the predicted property parameter set comprises a density, a viscosity and a surface tension, and the measured physical property parameter set comprises a measured density, a measured viscosity and a measured surface tension of the measured fluid.

13. The method of claim 8, wherein a guide angle is provided at a top of the opening of the vessel, and the vessel shape information comprises a cross-section area of the vessel, a cross-section area of the opening of the vessel, a length of the opening of the vessel and the guide angle.

14. The method of claim 8, wherein the vessel is spatially separated from the loader.

* * * * *